US009225117B2

(12) United States Patent
Jacobsson

(10) Patent No.: US 9,225,117 B2
(45) Date of Patent: Dec. 29, 2015

(54) MODULAR FIELD DEVICE CONNECTION UNIT

(71) Applicant: ABB Technology AG, Zürich (CH)

(72) Inventor: Peter Jacobsson, Västerås (SE)

(73) Assignee: ABB TECHNOLOGY AG, Zurich (CH)

( * ) Notice: Subject to any disclaimer, the term of this patent is extended or adjusted under 35 U.S.C. 154(b) by 0 days.

(21) Appl. No.: 14/326,865

(22) Filed: Jul. 9, 2014

(65) Prior Publication Data

US 2015/0017842 A1  Jan. 15, 2015

(30) Foreign Application Priority Data

Jul. 9, 2013   (DE) .......................... 10 2013 011 377

(51) Int. Cl.
*H01R 13/64* (2006.01)
*H01R 13/645* (2006.01)
*G05B 19/042* (2006.01)
(Continued)

(52) U.S. Cl.
CPC .......... *H01R 13/645* (2013.01); *G05B 19/0423* (2013.01); *H01R 13/514* (2013.01); *H05K 7/1455* (2013.01); *G05B 2219/23349* (2013.01); *G05B 2219/25314* (2013.01)

(58) Field of Classification Search
CPC .. H01R 13/645; H01R 13/514; H05K 7/1455; G05B 2219/25314; G05B 19/0423; G05B 2219/23349
USPC ................................... 439/680, 681
See application file for complete search history.

(56) References Cited

U.S. PATENT DOCUMENTS

| 6,196,881 B1 | 3/2001 | Abert et al. | |
|---|---|---|---|
| 8,911,263 B2 * | 12/2014 | Becavin | 439/681 |
| 8,951,074 B2 * | 2/2015 | Severac | 439/681 |

FOREIGN PATENT DOCUMENTS

| DE | 296 20 410 U1 | 1/1998 |
|---|---|---|
| DE | 299 06 583 U1 | 7/1999 |

(Continued)

OTHER PUBLICATIONS

European Search Report issued on Jan. 8, 2015, by the European Patent Office in corresponding European Patent Application No. 14002298.9-1808 (4 pages).

(Continued)

*Primary Examiner* — Javaid Nasri
(74) *Attorney, Agent, or Firm* — Buchanan Ingersoll & Rooney PC

(57) ABSTRACT

An exemplary field device connection unit includes a base plate on which a plurality of connection elements for connection of connecting lines with field devices and a plurality of module slots for receiving in each case one plug-in unit of different plug-in unit types. To avoid erroneous configurations, an identical type coding is assigned to the plug-in units of the same plug-in unit type, which identical type coding is formed by a plurality of wedge-shaped code elements which are anchored rigidly in the plug-in unit, and a plurality of wedge-shaped code elements are assigned to each module slot, which wedge-shaped code elements are mounted moveably about a rotary spindle between two opposite stops and whose wedge tips are oriented, in an initial rest position, centrally between the stops.

16 Claims, 11 Drawing Sheets

(51) Int. Cl.
  *H05K 7/14*  (2006.01)
  *H01R 13/514*  (2006.01)

(56) References Cited

FOREIGN PATENT DOCUMENTS

| DE | 101 35 980 C1 | 4/2003 |
| DE | 10 2004 056242 A1 | 5/2006 |
| DE | 10 2011 118 524 A1 | 5/2013 |
| EP | 0 592 712 A1 | 4/1994 |

OTHER PUBLICATIONS

Examination Report mailed on Mar. 12, 2014, by the German Patent Office for Application No. 10 2013 011 377.6.

\* cited by examiner

MODULAR FIELD DEVICE CONNECTION UNIT

RELATED APPLICATION(S)

This application claims priority under 35 U.S.C. §119 to German application DE 102013011377.6 filed in Germany on Jul. 9, 2013. The entire content of which is hereby incorporated by reference.

FIELD

The present disclosure relates to a modular field device connection unit for electrically connecting field devices to a control component in an automation device.

BACKGROUND DISCUSSION

Known field devices can be technical devices in an automation industry which are in a direct relationship with a production process. Such field devices can be both actuators, such as actuating elements or valves, and sensors, such as measuring transducers, in factory and process automation. The field devices can be connected to a superordinate control system, usually via a fieldbus, with the aid of a connection line. By means of this connection, data can be interchanged and then used for regulation, control and further processing. Frequently used communications standards for fieldbuses are CAN, HART, PROFIBUS or can also be formed on the basis of ETHERNET, Profinet, IP.

Furthermore, these field devices, such as 4-20 mA devices, but also those with a fieldbus, can be supplied energy via this connection line.

In some instances, the connection line is not routed directly from the respective field device to the control component, but initially individually from the respective field device to a field device connection unit, which is then connected to the control component by a trunk cable, such as a bus cable. DE 101 35 980 C1 discloses an arrangement for connecting field devices arranged decentrally and in the immediate vicinity of the process to a remote, central device in an automation installation with a distribution board which has at least one communications interface for communicating with the remote, central device, a plurality of pluggable input/output modules and a multi-pole terminal panel for connecting the field devices. The input/output modules have a system-side communications interface and a field-side communications interface in the same plug-in plane. The system-side communications interfaces of the I/O modules are connected to the communications interface for communication with the central device. The field-side communications interfaces of the I/O modules and the terminal panel are connected to contacts of a plug-type contact apparatus which are separate from one another.

In this case, a configuration-determining plug-in unit is provided which has a mating plug-in contact apparatus corresponding to the plug-in contact apparatus and conductor links for electrically connecting contacts, which are separate from one another, of the plug-in contact apparatus in such a way that in each case one field device is connected to the field-side communications interface of at least one I/O module. Erroneous assignments of the device with incorrect configuration-determining plug-in units can in this case result in serious faults in the field device connection unit.

SUMMARY

An exemplary field device connection unit is disclosed, including a base plate on which a plurality of connection elements for connection of connecting lines with field devices and a plurality of module slots for receiving in each case one plug-in unit of different plug-in unit types, wherein plug-in units of a same plug-in unit type have an identical type coding which is formed by a plurality of wedge-shaped code elements which are anchored rigidly in the plug-in unit, and wherein each module slot has a plurality of wedge-shaped code elements, which are mounted moveably about a rotary spindle between two opposite stops, and whose wedge tips are oriented, in an initial rest position, centrally between the stops.

DETAILED DESCRIPTION

Figure 1:
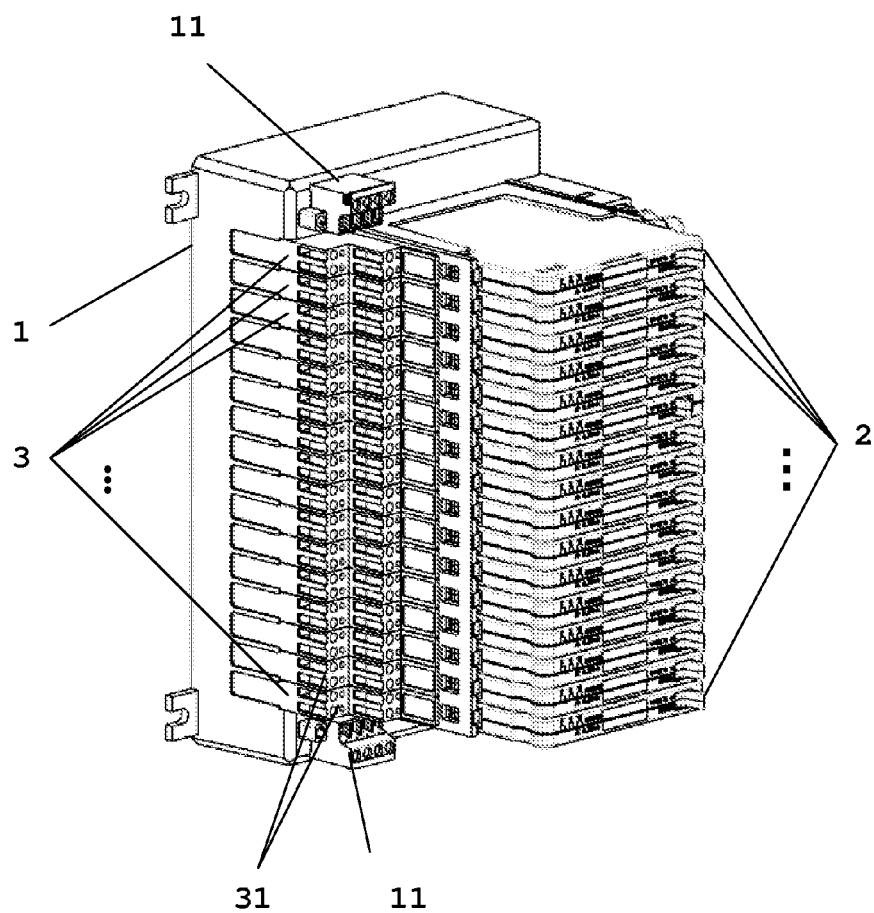
FIG. 1 illustrates a perspective view of a field device connection unit in accordance with an exemplary embodiment of the present disclosure.

Exemplary embodiments of the present disclosure specify a field device connection unit in which erroneous configurations are avoided.

Exemplary embodiments described herein provide a field device connection unit having a base plate, on which a plurality of connection elements for the connection of connecting lines with field devices and a plurality of module slots for receiving in each case one plug-in unit. In this case, the connectable field devices can differ in terms of their connection type and their operation. Identical field devices belong to one field device type.

Corresponding to the respectively connected field devices, the plug-in units have different circuit arrangements, wherein each of the circuit arrangements belongs to a specific field device type. Identical plug-in units belong to one plug-in unit type.

All of the plug-in units of the same plug-in unit type have an identical type coding, which can be formed by a plurality of wedge-shaped code elements which are anchored rigidly in the plug-in unit.

The wedge tips of the wedge-shaped code elements point in the plug-in direction of the module slot on the base plate and are flattened parallel to the plane of the base plate, e.g., transversely to the plug-in direction, to form a resting surface. The wedge tips are therefore truncated.

Furthermore, the wedge-shaped code elements of the plug-in units are asymmetrical, wherein a side face, opening out into the wedge tip, of each code element is oriented in the plug-in direction.

Each module slot has a plurality of wedge-shaped code elements, which can be mounted moveably about a rotary spindle between two opposite stops, and whose wedge tips can be oriented, in an initial rest position, centrally between the stops. The wedge tips are flattened to form a resting surface, wherein the resting surface is oriented parallel to the plane of the base plate, e.g., transversely to the plug-in direction, in the initial rest position.

When a plug-in unit is first plugged onto a module slot, the moveable code elements of the module slot are pivoted about their rotary spindle depending on the orientation of the corresponding wedge-shaped code element of the plug-in unit onto the stop which is opposite the wedge tip of the rigid code element of the plug-in unit and remains in this position. As a result, the module slot undergoes initial coding, which enables exclusive assignment to a plug-in unit of the same plug-in unit type.

After the initial coding, now only plug-in units of the same plug-in unit type can be fitted onto the module slot because only in the case of the plug-in units of the same plug-in unit type do the edges of the corresponding wedge-shaped code elements of the plug-in unit and of the module slot complement one another. In the case of plug-in units of another plug-in unit type, the resting surface of at least one code element of the plug-in unit hits the resting surface of at least one code element of the module slot. As a result, a plug-in unit of the incorrect plug-in unit type cannot be plugged onto a module slot coded for another plug-in unit type.

FIG. 1 illustrates a perspective view of a field device connection unit in accordance with an exemplary embodiment of the present disclosure. As shown in FIG. 1, a field device connection unit includes a base plate 1, on which a plurality of connection elements 3 for the connection of connecting lines with field devices and a plurality of module slots for receiving in each case one plug-in unit 2. Each plug-in unit 2 is assigned to a connection element 3. The connection elements 3 have screw terminals 31 for the connection of connecting lines with field devices.

Furthermore, the base plate 1 is equipped with further screw terminals 11 for the connection of connecting lines with a superordinate control component.

Figure 2:
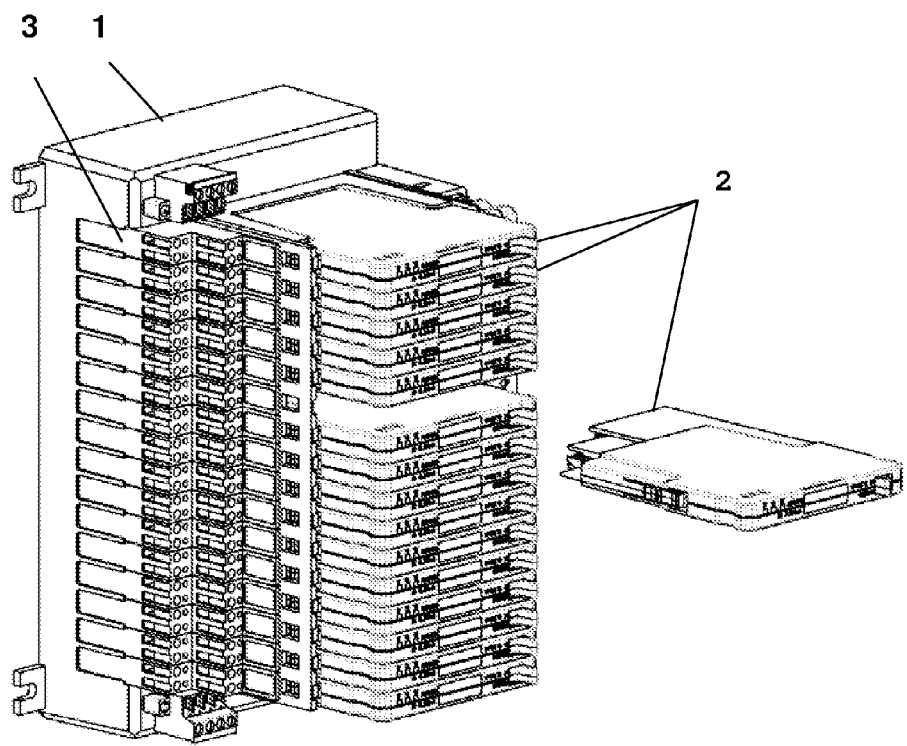
FIG. 2 illustrates a perspective view of a field device connection unit with a withdrawn plug-in unit in accordance with an exemplary embodiment of the present disclosure.

FIG. 2 illustrates a perspective view of a field device connection unit with a withdrawn plug-in unit in accordance with an exemplary embodiment of the present disclosure.

As shown in FIG. 2, corresponding to the respectively connected field devices, the plug-in units 2 have different circuit arrangements, wherein each of the circuit arrangements belongs to a specific field device type. In this case, the connectable field devices can differ in terms of their connection type and their operation. Identical field devices belong to one field device type.

Identical plug-in units 2 belong to one plug-in unit type. Plug-in units 2 of the same plug-in unit type can be fitted replaceably on the same module slot. This ensures that only a plug-in unit 2 of the same plug-in unit type which belongs to the field device type is electrically connected to such a field device.

A plug-in unit 2 is connected to the field device when it is completely plugged in and connected to the associated connection element 3.

Figure 3:
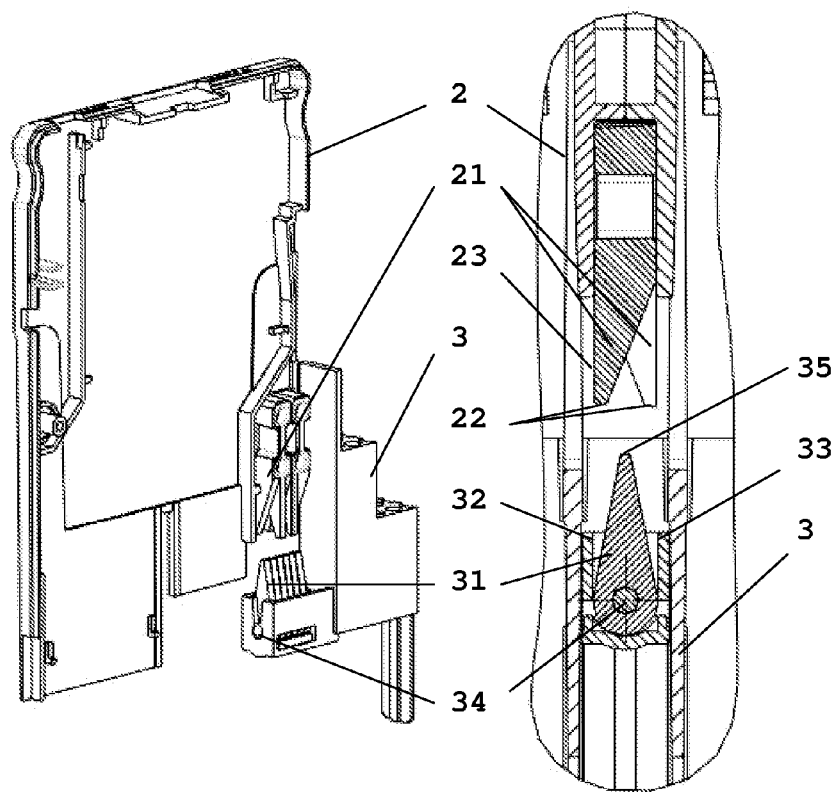
FIG. 3 illustrates a perspective view and a sectioned representation of a plug-in unit with a coding device in the initial state in accordance with an exemplary embodiment of the present disclosure.

FIG. 3 illustrates a perspective view and a sectioned representation of a plug-in unit with a coding device in the initial state in accordance with an exemplary embodiment of the present disclosure. As shown in FIG. 3, all of the plug-in units 2 of the same plug-in unit type can have an identical type coding, which is formed by a plurality of wedge-shaped code elements 21, which are rigidly anchored in the plug-in unit 2.

The wedge tips of the wedge-shaped code elements 21 point in the plug-in direction of the module slot on the base plate 1 and can be flattened parallel to the plane of the base plate 1, e.g., transversely to the plug-in direction, so as to form a resting surface 22.

Furthermore, the wedge-shaped code elements 21 of the plug-in units 2 can be formed asymmetrically, wherein a side face 23 opening out into the wedge tip of each code element 21 is oriented in the plug-in direction.

The individual coding of each plug-in unit type is formed by a predetermined pattern of alternately oriented side faces 23 of each code element 21.

Each module slot, including a connection element 3, has a plurality of wedge-shaped code elements 31, which are mounted moveably about a rotary spindle 34 between two opposite stops 32 and 33 and whose wedge tips are oriented, in an initial rest position, centrally between the stops 32 and 33. The wedge tips can be flattened to form a resting surface 35, wherein the resting surface 35 is oriented, in the initial rest position, parallel to the plane of the base plate 1, e.g., transversely to the plug-in direction.

Figure 4:
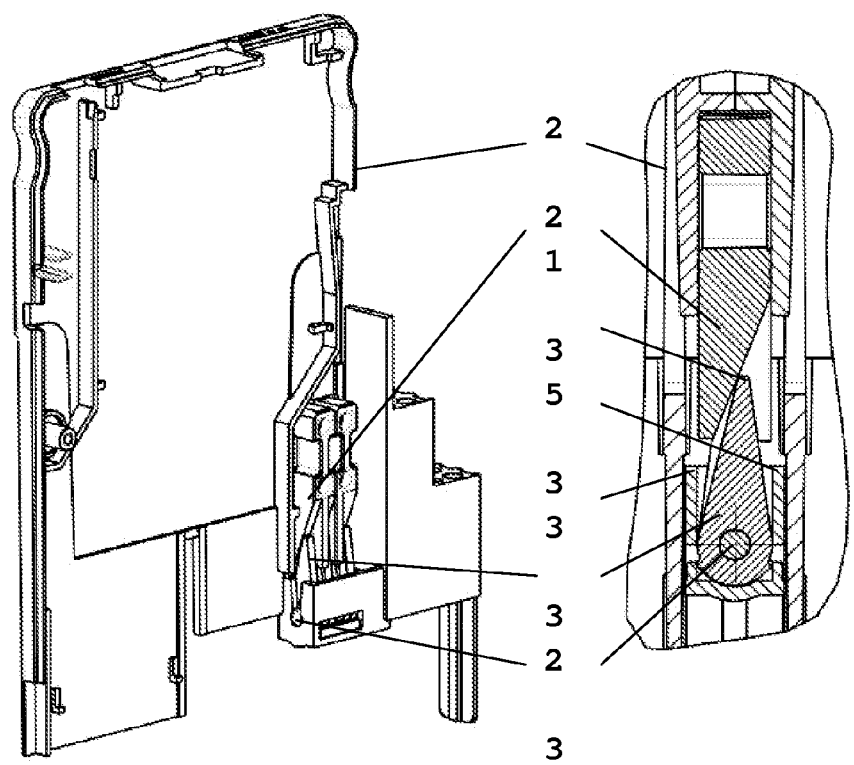
FIG. 4 illustrates a perspective view and a sectioned representation of a plug-in unit with a coding device during the plug-in coding operation in accordance with an exemplary embodiment of the present disclosure.

FIG. 4 illustrates a perspective view and a sectioned representation of a plug-in unit with a coding device during the plug-in coding operation in accordance with an exemplary embodiment of the present disclosure. Using identical reference symbols for the same means, FIG. 4 shows a perspective illustration and an enlarged, sectioned illustration of an open plug-in unit 2 in relation to a corresponding connection element 3 within the scope of exemplary elements provided in the disclosure during the initial coding of the module slot with respect to a plug-in unit type.

When the plug-in unit 2 is plugged in, its wedge-shaped code elements 21 catch the wedge-shaped code elements 31 which are in the neutral mid-position on the module slot on the resting surface 35 of said code elements and pivot the wedge-shaped code elements 31 about their rotary spindle 34 up to one of the stops 32 and 33.

Figure 5:
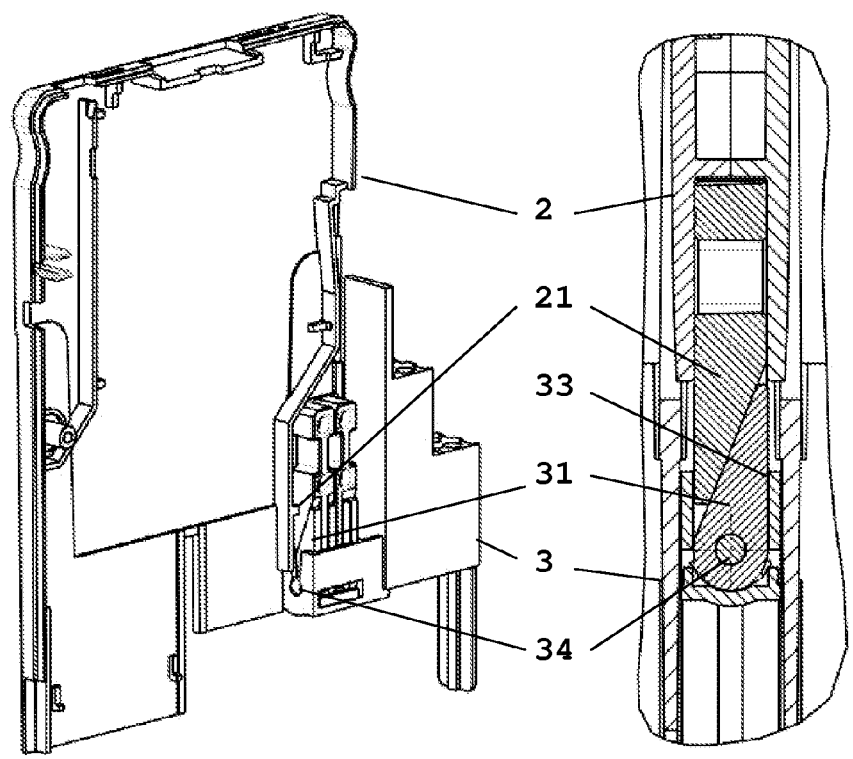
FIG. 5 illustrates a perspective view and a sectioned representation of a plugged-in plug-in unit with a coded coding device in accordance with an exemplary embodiment of the present disclosure.

FIG. 5 illustrates a perspective view and a sectioned representation of a plugged-in plug-in unit with a coded coding device in accordance with an exemplary embodiment of the present disclosure. Using identical reference symbols for the same means, FIG. 5 illustrates the termination of the initial coding operation. The plug-in unit 2 is completely plugged in. The wedge-shaped code elements 31 on the module slot are pivoted by the wedge-shaped code elements 21 of the plug-in unit 2 up to one of the stops 32 and 33. The individual coding operation of this module slot with respect to the plug-in unit type of the respective plug-in unit 2 is thus terminated.

Figure 6:
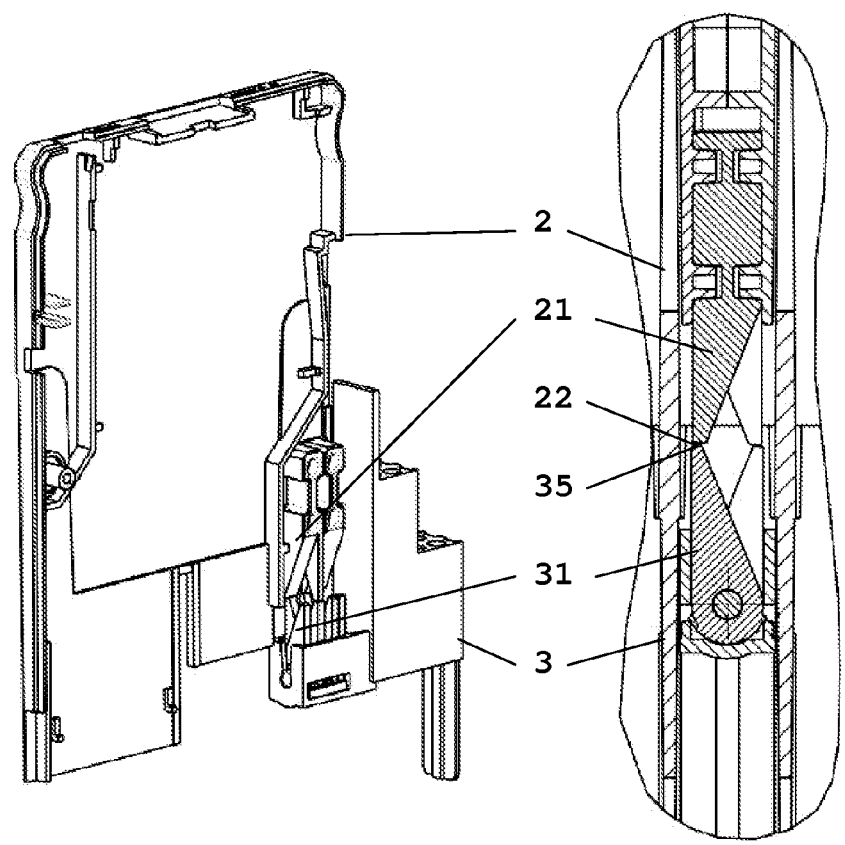
FIG. 6 illustrates a perspective view and a sectioned representation of an inappropriate plug-in unit with a coded coding device in accordance with an exemplary embodiment of the present disclosure.

FIG. 6 illustrates a perspective view and a sectioned representation of an inappropriate plug-in unit with a coded coding device in accordance with an exemplary embodiment of the present disclosure. Using the same reference symbols for identical means, FIG. 6 shows a module slot coded with respect to a plug-in unit type, which module slot is intended to be populated erroneously with a plug-in unit 2 of another plug-in unit type. The population is prevented by virtue of the fact that at least one wedge-shaped code element 21 of the plug-in unit 2 hits at least one wedge-shaped code element 31 at the module slot. In this case, the resting surface 22 of the at least one wedge-shaped code element 21 of the plug-in unit 2 impacts on the resting surface 35 of the at least one wedge-shaped code element 31 at the module slot and safely prevents the plug-in unit 2 from being plugged in any further and thus also prevents erroneous electrical contact-making of the plug-in unit 2 with the corresponding connection element 3 and the field device.

Figure 7:
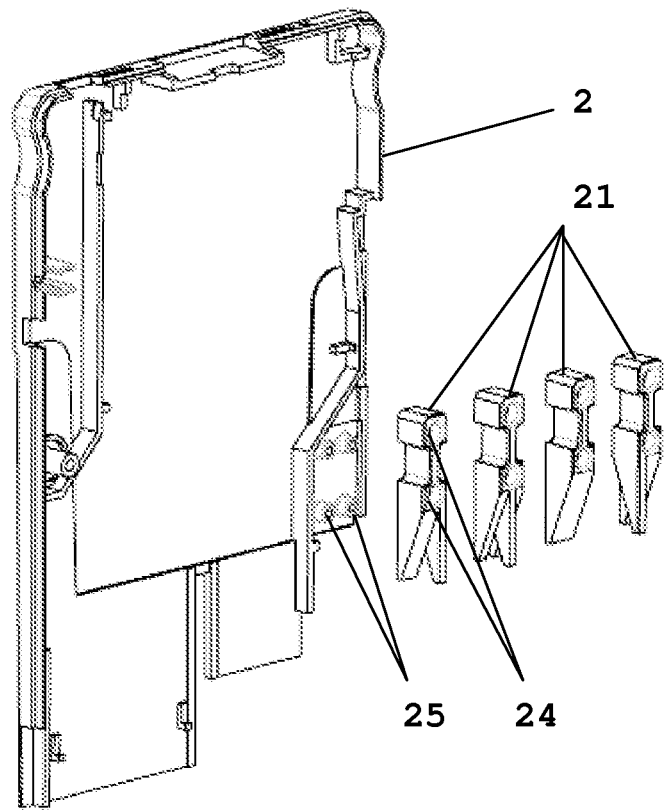
FIG. 7 illustrates a perspective view of a plug-in unit with coding means in accordance with an exemplary embodiment of the present disclosure.

FIG. 7 illustrates a perspective view of a plug-in unit with coding means in accordance with an exemplary embodiment of the present disclosure. FIG. 7 shows a perspective illustration of a plug-in unit 2 with different wedge-shaped code elements 21. The wedge-shaped code elements 21 are in the form of elements which can be lined up in a row and which can optionally be combined corresponding to the plug-in unit type to be coded. The different code elements 21 have one or more wedge elements with visually different wedge widths.

In an exemplary embodiment of the present disclosure, a wedge-shaped code element 21 can receive three wedge elements of the same wedge width. Depending on the orientation of the wedge elements, the wedge-shaped code elements 21 have different shapes and therefore different codes. In this case, successive wedge elements of the same orientation appear visually as different wedge widths.

Each wedge-shaped code element 21 can be inserted into the plug-in unit 2 as illustrated in FIG. 7 or rotated through 180° about the longitudinal axis. With two of the four wedge-shaped code elements 21 illustrated per plug-in unit 2, already 64 different plug-in unit types are codeable.

In addition, the wedge-shaped code elements 21 have cutouts 24, into which elevations 25 of the plug-in unit 2 engage.

During manufacture, the two selected wedge-shaped code elements 21 can be inserted into the plug-in unit 2 corresponding to the plug-in unit type to be coded and prefabricated.

Figure 8:
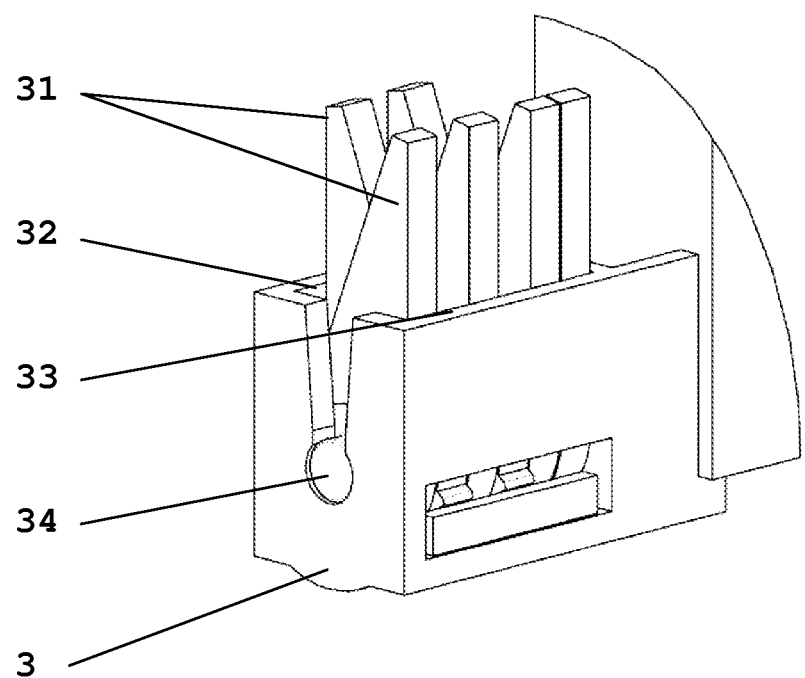
FIG. 8 illustrates a perspective view of a detail of a coded coding device in accordance with an exemplary embodiment of the present disclosure.

FIG. 8 illustrates a perspective view of a detail of a coded coding device in accordance with an exemplary embodiment of the present disclosure. FIG. 8 shows, in enlarged form, using identical reference symbols for the same means, a perspective illustration of a detail of a coded coding device of the connection element 3. The wedge-shaped code elements 31 can be pivotable about a rotary spindle 34 at the module slot between the two stops 32 and 33. As shown in FIG. 8, two wedge-shaped code elements 31 rest on the stop 32 and four wedge-shaped code elements 31 rest on the stop 33. The six wedge-shaped code elements 31 shown in this exemplary embodiment correspond to the two of four wedge-shaped code elements 21 illustrated, each having three wedge elements, of the plug-in unit 2 shown in FIG. 7.

Figure 9:
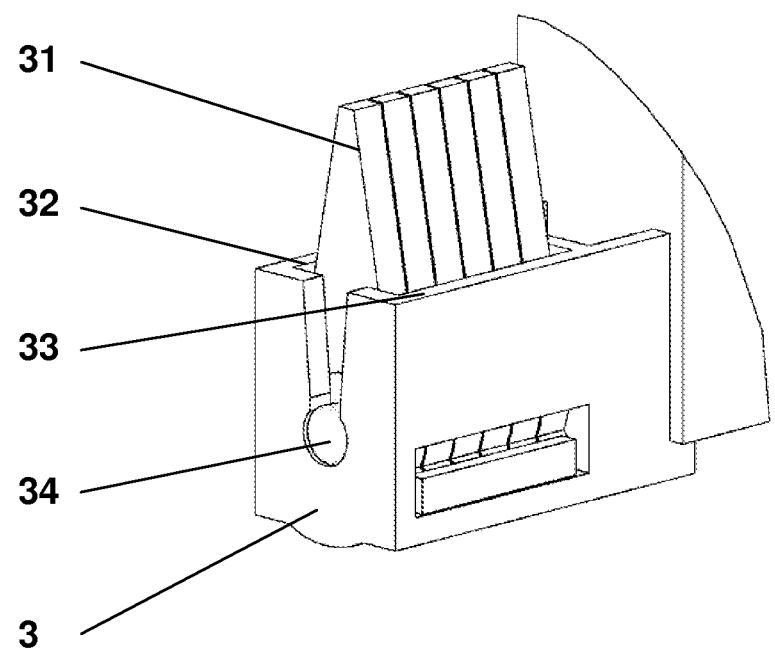
FIG. 9 illustrates a perspective view of an initial coding device in accordance with an exemplary embodiment of the present disclosure.

FIG. 9 illustrates a perspective view of an initial coding device in accordance with an exemplary embodiment of the present disclosure. FIG. 9 shows, in enlarged form, using identical reference symbols for the same means, a perspective illustration of a detail of an initial, e.g., as yet uncoded, coding device of the connection element 3. All of the wedge-shaped code elements 31 are located in the neutral mid-position between the stops 32 and 33.

Figure 10:
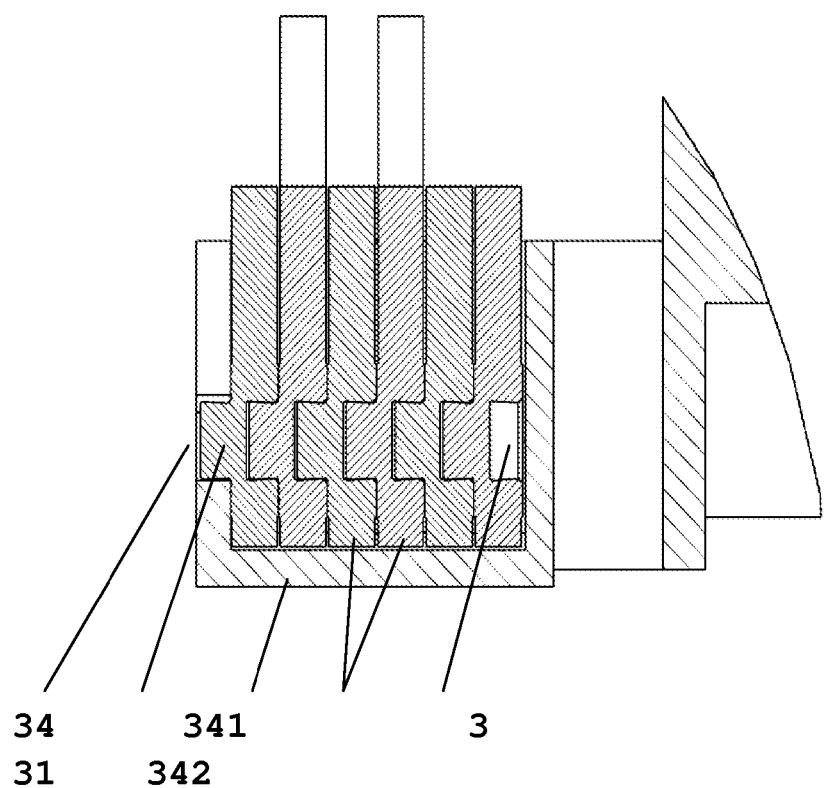
FIG. 10 illustrates a sectioned representation of a coded coding device in accordance with an exemplary embodiment of the present disclosure.

FIG. 10 shows, in enlarged form, using identical reference symbols for the same means, a sectioned illustration of a detail of a coded coding device of the connection element 3. In an exemplary embodiment of the present disclosure, the wedge-shaped code elements 31 have pin-shaped protuberances 341 along the rotary spindle 34 and, on the opposite side, cutouts 342 corresponding to these protuberances 341, which cutouts and protuberances engage in one another such that together they form a segmented rotary spindle 34.

Figures 11, 12:
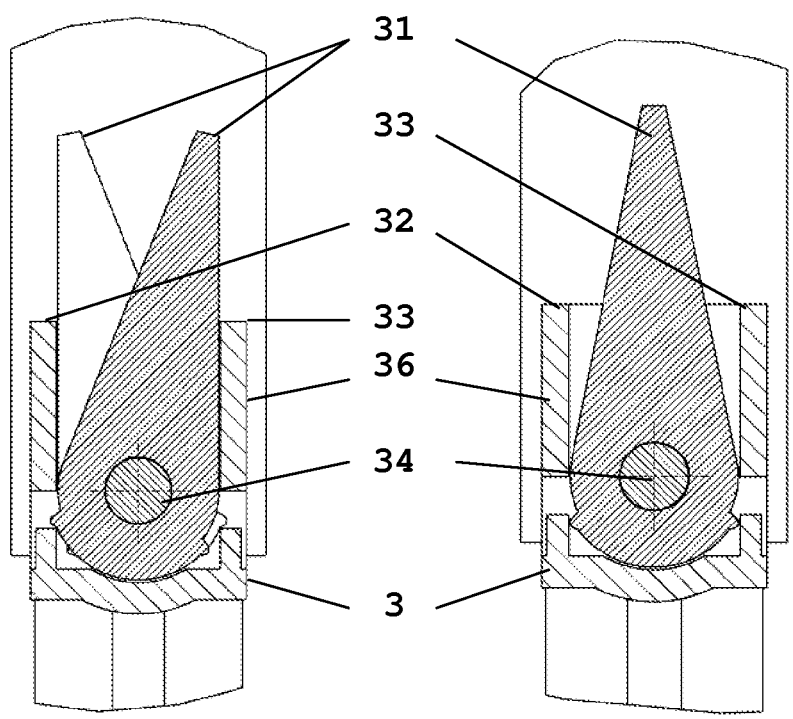
FIG. 11 illustrates a partially sectioned representation of a coded coding device in accordance with an exemplary embodiment of the present disclosure.
FIG. 12 illustrates a partially sectioned illustration of an initial coding device in accordance with an exemplary embodiment of the present disclosure.

FIG. 11 illustrates a partially sectioned representation of a coded coding device in accordance with an exemplary embodiment of the present disclosure. FIG. 12 illustrates a partially sectioned illustration of an initial coding device in accordance with an exemplary embodiment of the present disclosure FIG. 11 shows, in enlarged form, using identical reference symbols for the same means, a partially sectioned illustration of a detail of a coded coding device of the connection element 3. For comparison purposes, a partially sectioned illustration of a detail of an initial coding device of the connection element 3 is illustrated in enlarged form in FIG. 12 using identical reference symbols for the same means. Whilst at the same time making reference to FIGS. 11 and 12, the wedge-shaped code elements 31 of the connection element 3 are arranged rotatably in a cage 36. In an exemplary embodiment of the present disclosure, the cage 36 can be delimited by the stops 32 and 33. Furthermore, the cage 36 has cutouts 37. The wedge-shaped code elements 31 have latching tabs 38.

In the initial rest position of the wedge-shaped code elements 31 centrally between the stops 32 and 33, as shown in FIG. 12, the latching tabs 38 lock the wedge-shaped code elements 31 in a force-fitting manner in the cage 36.

In the coded position of the wedge-shaped code elements 31 shown in FIG. 11, the latching tabs 38 engage in the corresponding cutouts 37 and lock the wedge-shaped code elements 31 in a form-fitting manner in the cage 36.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE SYMBOLS

1 Base plate
11 Screw terminal
2 Connection element
21, 31 Code element
22, 35 Resting surface
23 Side face
24 Cutout
25 Elevation
3 Plug-in unit
32, 33 Stop face
34 Rotary spindle
341 Protuberance
342, 37 Cutout
36 Cage
38 Latching tab

What is claimed is:

1. A field device connection unit comprising:
a base plate on which a plurality of connection elements for connection of connecting lines with field devices and a plurality of module slots for receiving in each case one plug-in unit of different plug-in unit types,
wherein plug-in units of a same plug-in unit type have an identical type coding which is formed by a plurality of wedge-shaped code elements which are anchored rigidly in the plug-in unit, and
wherein each module slot has a plurality of wedge-shaped code elements, which are mounted moveably about a rotary spindle between two opposite stops, and whose wedge tips are oriented, in an initial rest position, centrally between the stops.

2. The field device connection unit as claimed in claim 1, wherein the wedge tips of the wedge-shaped code elements are flattened to form a resting surface.

3. The field device connection unit as claimed in claim 2, wherein the wedge-shaped code elements of the module slot, after an initial coding, pivoted about the rotary spindle by the first plugged-in plug-in unit, rest on one of the opposite stops.

4. The field device connection unit as claimed in claim 3, wherein the wedge-shaped code elements of the module slot have corresponding protuberances and cutouts, which form a segmented rotary spindle.

5. The field device connection unit as claimed in claim 2, wherein the wedge-shaped code elements of the module slot are guided in a cage.

6. The field device connection unit as claimed in claim 5, wherein the wedge-shaped code elements of the module slot, in an initial rest state, are locked in a force-fitting manner and, in a coded state, are locked in a form-fitting manner.

7. The field device connection unit as claimed in claim 1, wherein the wedge-shaped code elements of the plug-in units are asymmetrical, and wherein a side face, opening out into the wedge tip, of each code element is oriented in the plug-in direction.

8. The field device connection unit as claimed in claim 7, wherein the wedge tips of the wedge-shaped code elements are flattened to form a resting surface.

9. The field device connection unit as claimed in claim 7, wherein the wedge-shaped code elements of the module slot, after an initial coding, pivoted about the rotary spindle by the first plugged-in plug-in unit, rest on one of the opposite stops.

10. The field device connection unit as claimed in claim 9, wherein the wedge-shaped code elements of the module slot have corresponding protuberances and cutouts, which form a segmented rotary spindle.

11. The field device connection unit as claimed in claim 7, wherein the wedge-shaped code elements of the module slot are guided in a cage.

12. The field device connection unit as claimed in claim 11, wherein the wedge-shaped code elements of the module slot, in an initial rest state, are locked in a force-fitting manner and, in a coded state, are locked in a form-fitting manner.

13. The field device connection unit as claimed in claim 1, wherein the wedge-shaped code elements of the module slot, after an initial coding, pivoted about the rotary spindle by the first plugged-in plug-in unit, rest on one of the opposite stops.

14. The field device connection unit as claimed in claim 13, wherein the wedge-shaped code elements of the module slot have corresponding protuberances and cutouts, which form a segmented rotary spindle.

15. The field device connection unit as claimed in claim 1, wherein the wedge-shaped code elements of the module slot are guided in a cage.

16. The field device connection unit as claimed in claim 15, wherein the wedge-shaped code elements of the module slot, in an initial rest state, are locked in a force-fitting manner and, in a coded state, are locked in a form-fitting manner.

* * * * *